United States Patent [19]

Nobue

[11] Patent Number: 4,739,178
[45] Date of Patent: Apr. 19, 1988

[54] IMAGE SENSOR HAVING OVER-SIZED WINDOW

[75] Inventor: Mamoru Nobue, Ebina, Japan

[73] Assignee: Fuji-Xerox Company Ltd., Tokyo, Japan

[21] Appl. No.: 875,411

[22] Filed: Jun. 17, 1986

[30] Foreign Application Priority Data

Jun. 21, 1985 [JP] Japan .................. 60-135425

[51] Int. Cl.⁴ .......................... H01L 27/14
[52] U.S. Cl. ...................... 250/578; 357/30
[58] Field of Search ............. 250/578, 211 J; 357/30 H, 30 K, 30 L, 31; 358/212, 213

[56] References Cited

U.S. PATENT DOCUMENTS

4,141,024  2/1979  Kano et al. ................ 250/211 J
4,354,104  10/1982  Chikamura et al. ......... 250/211 J
4,607,168  8/1986  Oritsuki et al. ............ 250/578

Primary Examiner—David C. Nelms
Assistant Examiner—Stephone B. Allen
Attorney, Agent, or Firm—Schwartz & Weinrieb

[57] ABSTRACT

An image sensor comprises a plurality of photoelectric converting elements of the sandwich type arranged on a substrate in which a photoelectric conversion layer is sandwiched between upper and lower electrodes and a light shielding film having a window for controlling the quantity of incident light is formed so as to correspond to each of the photoelectric converting elements, wherein, noting the fact that a photoelectric current can be dervied from a wider area than the actual area of a photoelectric converting region, an overlapped region of lower and upper electrodes in each of the photoelectric converting elements is made smaller in area than that of the window.

20 Claims, 6 Drawing Sheets

| NON-SANDWICH PORTION | SANDWICH PORTION | NON-SANDWICH PORTION |

IMAGE SENSOR HAVING OVER-SIZED WINDOW

BACKGROUND OF THE INVENTION

1. Field of the Invention

The present invention relates to an image sensor, and particularly to a high resolution contact type image sensor suppressing interference between adjacent bits.

2. Description of the Prior Art

A contact type image sensor based on an elongated reading element having a sensor section whose width is the same as that of an original document can be used as a large-area image sensing device which does not require a reduction optical system. Such an image sensor includes as its photoelectric converting layer an amorphous semiconductor layer made of a material such as amorphous silicon (a-Si) or a poly-crystalline thin film made of a material such as cadmium sulfide (CdS) or cadmium selenide (CdSe). The image sensor of this type has been widely applied to compact type original document readers, or the like.

Figure 7:
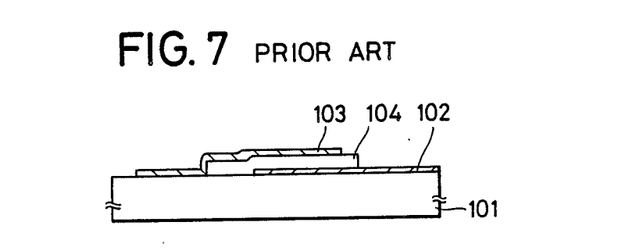
FIGS. 7, 8, 9, and 10 show a prior art image sensor.

As one of the basic structures of the sensor section of this image sensor, there is a sandwich structure. As shown in FIG. 7, a sandwich type sensor element comprises a photoelectric converting layer 104 which is sandwiched between a light permeable upper electrode 103 and a lower electrode 102 formed on a substrate 101. In a contact type image sensor, a plurality of the sandwich type sensor elements are arranged in a row on an elongated substrate (for example, in case of 8 dots per mm, 1728 elements for JIS A-4 and 2048 for JIS B-4).

In order to perform precise reading, these sensor elements must be completely independent from each other and the light receiving region of the sensor elements must have the same area. For this reason, many experiments have been conducted in order to precisely define the light receiving area of each sensor element provided on the elongated substrate.

Figure 8:
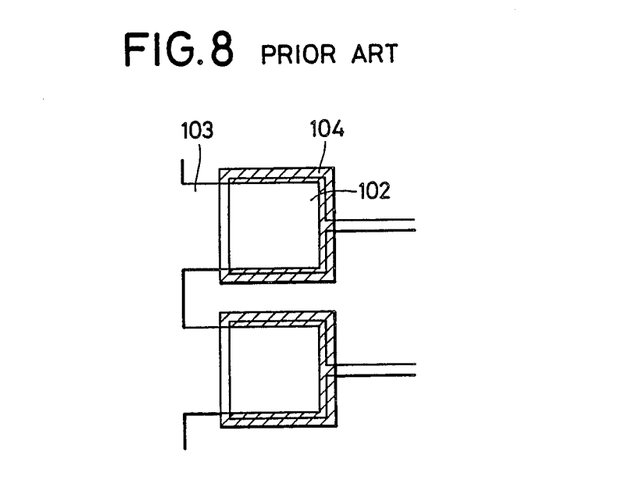

For example, in each sensor element of the most fundamental contact type image sensor shown in FIG. 8, both the lower electrode 102 and the photoelectric converting layer 104 are separately formed, and further the operating section of the light permeable upper electrode 103 is separately formed so as to define the region of a photoelectric converting layer sandwiched between the lower electrode 102 and the upper electrode 103 as a light receiving area (sensor area). The sensor elements are thus formed separately from each other.

In such a structure, since the lower electrode, the photoelectric converting layer and the upper electrode are formed by means of a photolitho-etching process, the fabricating process is complicated, and further each sensor element tends to have a different light receiving area due to non-alignment of a pattern, or other operational factors. Further, the reliability and the yield rate of the image sensor are degraded because the edge of the photoelectric converting layer disposed along the boundary associated with the fabricating mask is often contaminated and injured during such processes as a photolitho-etching process for forming the upper electrode.

Figure 9:
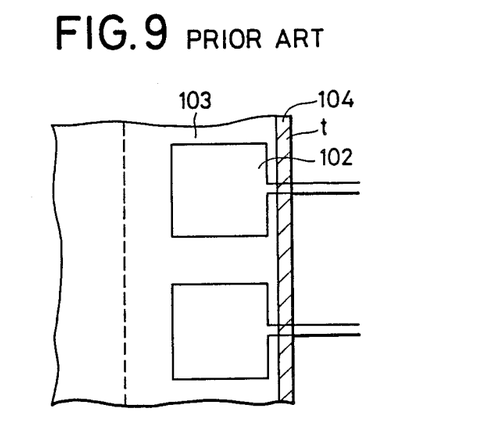

Further, in a contact type image sensor using as its photoelectric converting layer a non-doped amorphous silicon, since an amorphous silicon itself has a high resistance value (electrical resistivity in the dark is approximately $10^9$ $\Omega$cm), the separation (isolation) of adjacent bits (adjacent sensor elements) may be omitted or substantially reduced to zero. For example, as shown in FIG. 9, only the lower electrode 102 is formed separately, while the photoelectric converting layer 104 and the upper electrode 103 are respectively formed in the shape of a belt. In this structure, which is the same as the abovementioned structure, the light receiving area is defined by means of the overlapped region of the upper electrode and the lower electrode. Since a photolitho-etching process is utilized only for the formation of the lower electrode while the upper electrode is selectively formed by means of a sputtering process, or the like, through a metal mask, the fabricating process is simplified. However a photoelectric converting layer region corresponding to the edge of the metal mask is likely to be injured, resulting in the degradation of the yield rate.

In addition, there have been such problems as that of insufficient insulation between adjacent bits causing leakage of signals, and that the light receiving area is larger than the area defined by the lower electrode.

Figure 10:
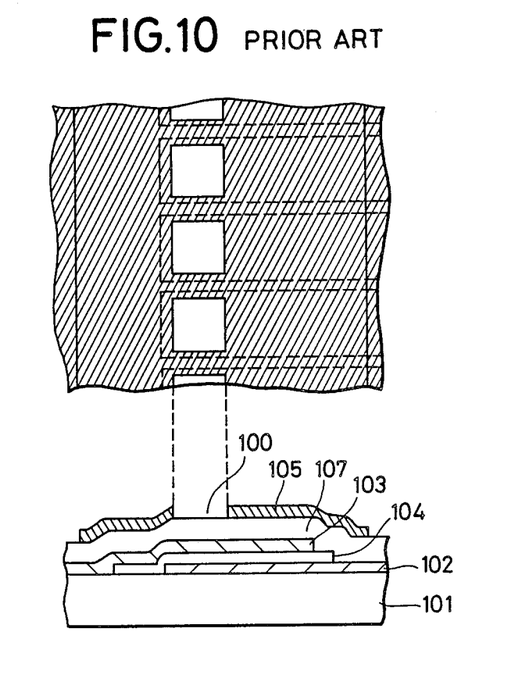

FIG. 10 shows one idea for providing a solution of those problems, in which the light receiving area is defined not by the members constituting the sensor elements, but by means of a light shielding film 105.

An example is shown in FIG. 10, in which the lower electrode 102 is formed by means of a larger pattern, and after a passivation film 107 is coated on the whole surface of a substrate on which the sensor elements have been formed, the light shielding film 105 is formed so as to define the light receiving area.

In this case, the patterning of a window section 100 formed in the light shielding film 105 is made by, for example, a photolitho-etching process in order to achieve a high degree of accuracy. Though these processes are complicated, the resolution is improved to a certain extent.

However, when the higher resolution is desired, space between adjacent bits must be made narrow. However, this results in an increase of the leakage of signals although the resistivity of a dark section of a photoconductive section beneath the light shielding film is high, for example, within the range of $10^9$ $\Omega$cm.

Assuming now that a light receiving region of the sensor element is a square whose side length is 80% of the sensor pitch P, then, the distance between adjacent bits is d $\leq$ 8.3 $\mu$m if the density of the sensor element is 24 dot/mm and P=41.6 $\mu$m, and the distance d $\leq$ 6.25 $\mu$m, if the density of the sensor element is 32 dot/mm and P=31.25 $\mu$m. Thus, the distance between adjacent bits is so narrow that a signal leaks between adjacent bits. This prevents resolution of the image sensor from being enhanced.

OBJECTS OF THE INVENTION

An object of the present invention is to provide an image sensor in which interference between adjacent bits is prevented and consequently the resolution of the image sensor is enhanced.

Another object of the present invention is to provide an image sensor in which a dark current in the image sensor is decreased and consequently the light to dark ratio (ratio of light current to dark current) is increased.

SUMMARY OF THE INVENTION

In accordance with the present invention, in an image sensor of the type wherein a light shielding film having a window for controlling the quantity of incident light is formed on the surface of photoelectric converting elements having a photoelectric conversion layer sandwiched between a lower electrode and an upper electrode, an overlapped region of the lower and upper electrodes is set to be smaller in area than a window defined within the light shielding film.

Further, in accordance with the present invention, in an image sensor of the type wherein a plurality of photoelectric converting elements, each having a photoelectric conversion layer sandwiched between a lower electrode and an upper electrode, are arranged on a single substrate, and a light shielding film having a window for controlling the quantity of incident light is formed on the surface of the photoelectric converting elements, an overlapped region of the lower and upper electrodes is defined so as to be smaller in area than the window defined within the light shielding film.

Preferably, the lower electrode is reduced in width such that its edge is disposed approximately 15 $\mu$m inside the edge of the window in the light shielding film.

BRIEF DESCRIPTION OF THE DRAWING

Various other objects, features, and attendant advantages of the present invention will become more apparent from the following detailed description, when considered in conjunction with the accompanying drawings, in which like reference characters designate like or corresponding parts throughout the several views, and wherein:

FIGS. 1(a) and 1(b) show a part of a contact type image sensor in accordance with an embodiment of the present invention. (FIG. 1(b) is a cross-sectional view taken along line A—A in FIG. 1(a));

DESCRIPTION OF THE PREFERRED EMBODIMENT

Before describing a preferred embodiment of the present invention, the concept of this invention will be described first.

Inventors of the present invention have confirmed the fact from results of many experiments that, for example, in the case where a separated lower electrode is provided for each sensor element, a photoelectric current can be derived from a larger region than the area of the lower electrode, that is, an effective sensing area is wider than the area of the lower electrode.

Figure 2:
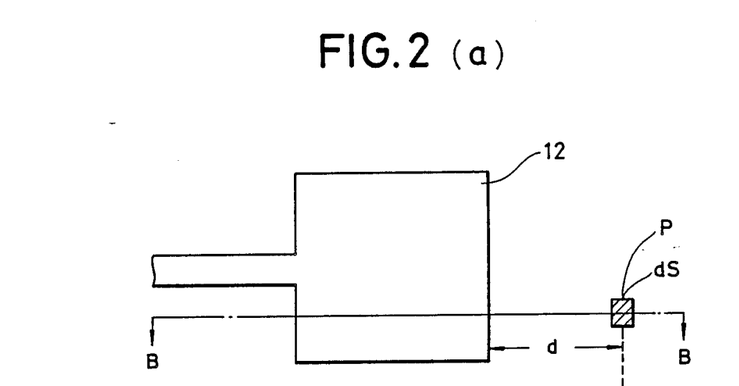
FIGS. 2(a) and 2(b) show the relation between an image sensor used for measurement and a position of light irradiation.
Figure 3:
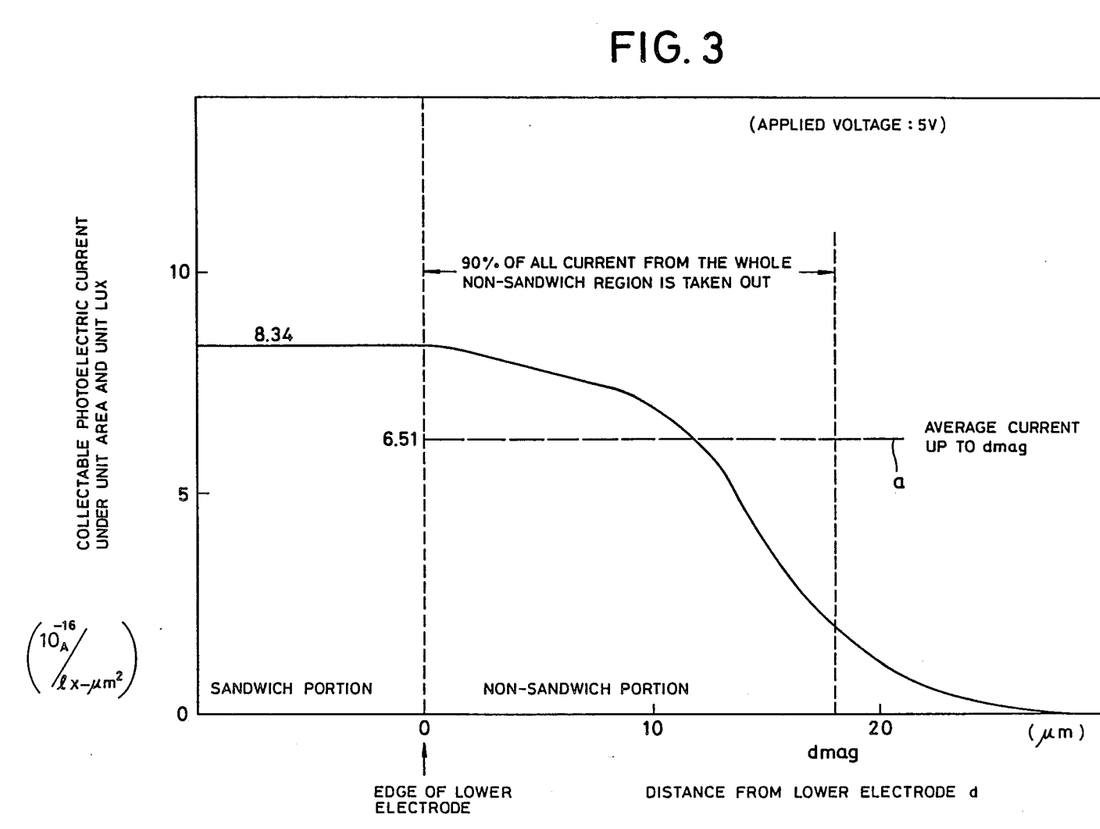
FIG. 3 is a graph showing the relation between distance d from a position of light irradiation onto the image sensor as shown in FIGS. 2(a) and 2(b) to the edge of the lower electrode and photoelectric current L derived from a unit area irradiated by a unit amount of lux.

In this experiment, as shown in FIGS. 2(a) and 2(b) wherein FIG. 2(b) is a cross-sectional view taken along line B—B in FIG. 2(a), an image sensor of sandwich type is used in which a lower electrode 12 made of a chrome thin film pattern, a photoelectric conversion layer 13 made of a hydrogenated amorphous silicon layer with a thickness of 1 $\mu$m and an upper electrode 14 made of indium tin oxide (ITO) are sequentially formed on an insulating substrate 11, and a photoelectric current is measured by irradiating light on a spot P which is separated by a distance d from the lower electrode. The relationship between the distance d ($\mu$m) and collectable photoelectric current per unit area and unit lux ($10^{-16}$ A/lx·$\mu$m$^2$) is shown in FIG. 3.

In this drawing, the horizontal axis indicates the distance d between the edge of the lower electrode and the measuring point, and the vertical axis indicates the measured current per unit area and unit lux, and the broken line a indicates the average current, $6.51 \times 10^{-16}$ A/lx·$\mu$m$^2$, derived from a non-sandwich region (that is, a region not provided with a lower electrode, that is, the region of d>0) extending from the edge of the lower electrode to a boundary distance d mag. Ninety percent (90%) of all current derived from the entire nonsandwich region is derived from this region. It is apparent from FIG. 3 that considerable photoelectric current can be derived from a point positioned approximately 15 $\mu$m from the edge of the lower electrode.

Figure 4:
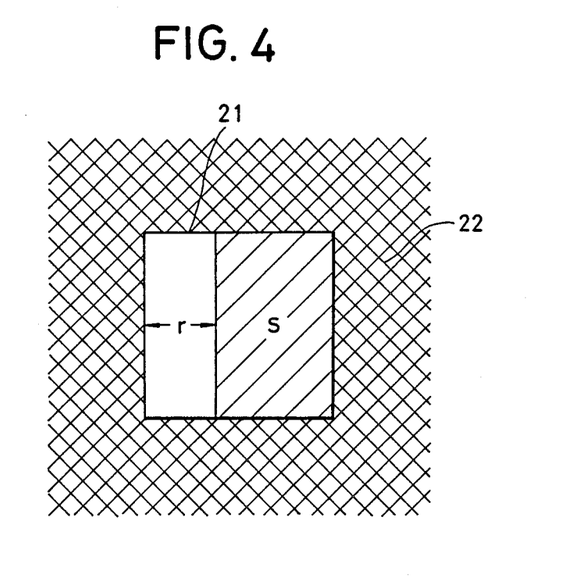
FIG. 4 is a model showing the distance r from the edge of a window formed in a light shielding film to a sandwich section S.

Then, using an image sensor of the sandwich type comprising as a photoelectric conversion layer a hydrogenated amorphous silicon layer of 1 $\mu$m thickness on which a light shielding film 22 having a window 21 is formed as shown in FIG. 4, inventors of the present invention have measured the photoelectric current per unit area and unit lux, $I_P$ (pA/lx·$\mu$m$^2$), while changing the distance r from the edge of a window 21 to the edge of a sandwich section S. The result is shown in FIG. 5, in which the horizontal axis indicates the distance r ($\mu$m) from the edge of the window to the sandwich section, and the vertical axis indicates the photoelectric current $I_P$ (pA/lx·$\mu$m$^2$) per unit area and unit lux.

Figure 5:
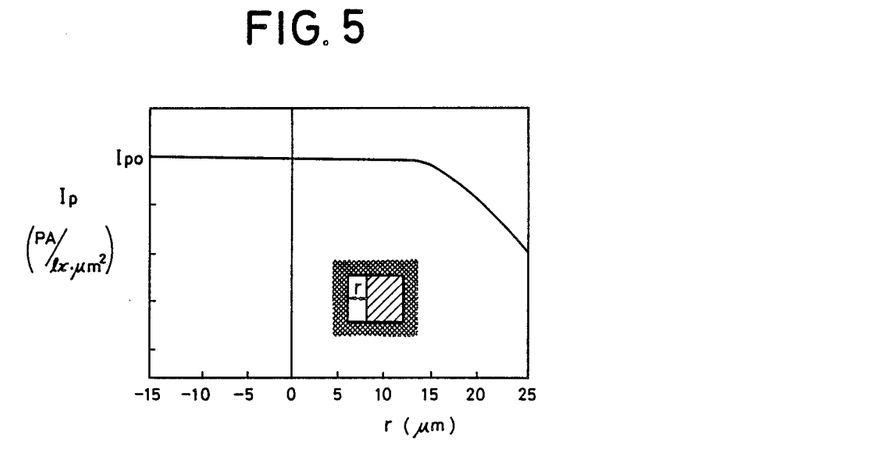
FIG. 5 is a graph showing the relation between the distance r shown in FIG. 4 and the photoelectric current $I_P$ in a unit area of the image sensor irradiated by a unit amount of lux.

It is apparent from FIG. 5 that the effective area of the sensor element is the same as that of the window, that is, the light receiving area, although the width of the lower electrode is distanced approximately 15 $\mu$m from the edge of the window.

The present invention is made by noting the fact that with the above-mentioned construction, the actual distance between adjacent lower electrodes can be larger, and consequently the mutual interference between adjacent bits can be significantly decreased so that it becomes possible to fabricate a contact type image sensor with high resolution, and further, the light to dark ratio can be increased by reducing the dark current.

Figure 1A:
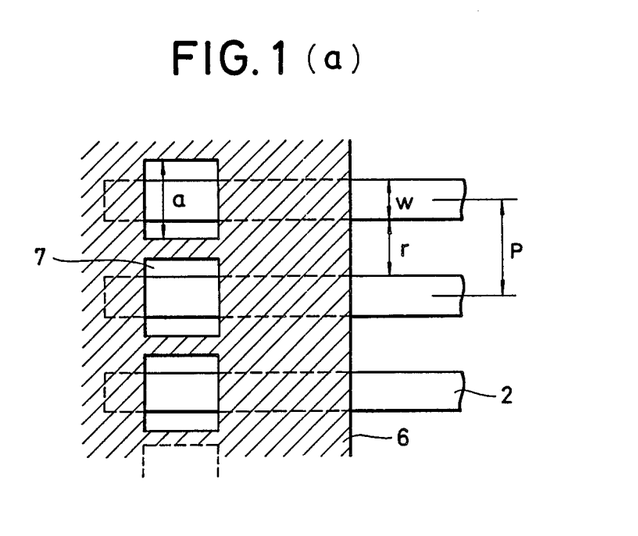
Figure 1B:
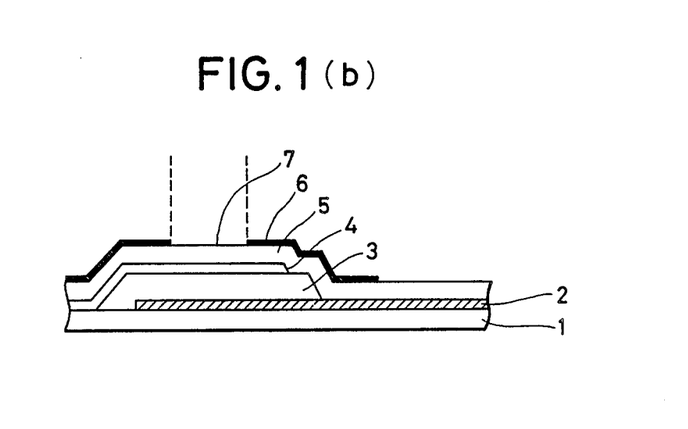

A contact type image sensor in accordance with an embodiment of the present invention, as shown in FIGS. 1(a) and 1(b) wherein FIG. 1(b) is a cross-sectional view taken along line A—A in FIG. 1(a), comprises a plurality of lower electrodes 2 (24 dot/mm) of a striped chrome thin film pattern with pitch P=41.6 $\mu$m, space I=28.2 $\mu$m and width W=13.4 $\mu$m disposed in a row on an insulating glass substrate 1, a belt-shaped photoelectric converting layer 3 made of hydrogenated amorphous silicon with 1 $\mu$m thickness, a belt-shaped light permeable upper electrode 4 made of indium tin oxide, a belt-shaped passivation film 5 formed on the upper electrode 4 and a belt-shaped light shielding film 6 made of silicon oxide having a window 7 with a side length a=33.3 $\mu$m such that the lower electrode 2 is positioned at the center thereof.

Each of the lower electrodes 2 has a width W=13.4 $\mu$m with the side edges thereof distanced 10 $\mu$m from both sides of the window 7. The image sensor having 24 dot/mm has high resolution and high reliability, because the space between adjacent lower electrodes is so large that interference between adjacent bits does not occur.

Futher, since the area of the lower electrode is reduced, a dark current which flows in approximate proportion to the area of the lower electrode decreases, thus increasing light to dark ratio.

Figure 6:
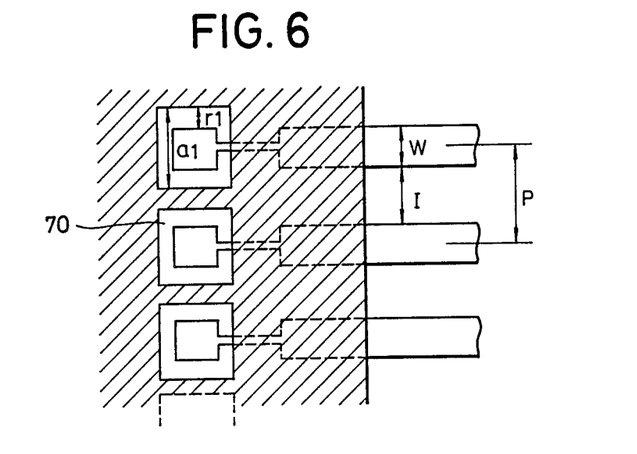
FIG. 6 shows a part of a contact type image sensor in accordance with another embodiment of the present invention.

Although the pattern of lower electrodes is made in the form of a stripe in accordance with the embodiment of the present invention, other patterns may be employed. For example, if each side of the lower electrode is respectively reduced by the distance r1 from each edge of the window as shown in FIG. 6, the dark current is further decreased. Assuming that a side length of the window 70 a1=100 $\mu$m, and that the distance r1=15 $\mu$m then the area sandwiched by the lower electrode and the upper electrode is approximately one half of the area of the lower electrode having the same area as the window area. In this case, the dark current becomes approximately one half.

Further, in accordance with the embodiment of the present invention, the lower electrode is divided and the light permeable upper electrode is a belt-shaped common electrode. However, the structure is not limited to this, but a structure in which a light permeable electrode is divided while a lower electrode is a common electrode may be employed.

Furthermore, each material of which the photoelectric converting layer, the lower electrode and the upper electrode are made respectively may be changed so as to alter its characteristic.

In addition, the present invention can be applied not only to an image sensor of such high density as 24 dot/mm but also to one of low density although it is not so effective because a sandwiched section can be reduced at most 15 $\mu$m in the case of using as a photoelectric converting layer hydrogenated amorphous silicon.

What is claimed is:

1. An image sensor, comprising:
a plurality of photoelectric converting elements of the sandwich type in which a photoelectric conversion layer of an amorphous semiconductor is sandwiched between upper and lower electrodes; and
a light shielding film formed so as to have a window defined therein for controlling the quantity of incident light impinging upon each of said photoelectric converting elements,
wherein the area of said window is greater than the area of an overlapped region of said upper and lower electrodes which is disposed within said window associated with each of said photoelectric converting elements.

2. An image sensor as set forth in claim 1, wherein:
said amorphous semiconductor is hydrogenated amorphous silicon, and
an edge portion of said overlapped region of said upper and lower electrodes is disposed at a maximum of 15 $\mu$m interiorly within an edge portion of said window.

3. An image sensor as set forth in claim 1, wherein:
said amorphous semiconductor is hydrogenated amorphous silicon, and
an edge portion of said overlapped region of said upper and lower electrodes is disposed at a maximum of 15 $\mu$m interiorly within an edge portion of said window as viewed in a width direction thereof.

4. An image sensor as set forth in claim 1, wherein:
said upper electrodes are fabricated from indium tin oxide.

5. An image sensor as set forth in claim 1, wherein:
said light shielding film is fabricated from silicon oxide.

6. An image sensor as set forth in claim 1, wherein:
said lower electrodes are disposed upon a substrate in the form of striped elements.

7. An image sensor as set forth in claim 6, wherein:
the pitch of said lower electrodes, as defined by the centerline-to-centerline spacing between adjacent lower electrodes, is 41.6 $\mu$m.

8. An image sensor as set forth in claim 6, wherein:
the spacing between successive edge portions of adjacent lower electrodes is 28.2 $\mu$m.

9. An image sensor as set forth in claim 6, wherein:
the width of each of said lower electrodes is 13.4 $\mu$m.

10. An image sensor as set forth in claim 6, wherein:
said window has the configuration of a square which is disposed over an end portion of each of said striped lower electrodes; and
each side of said square-shaped window has a length of 33.3 $\mu$m.

11. An image sensor as set forth in claim 6, wherein:
said window is disposed over an end portion of each of said striped lower electrodes such that three edge portions of each of said striped lower electrodes is disposed interiorly within said window area.

12. An image sensor as set forth in claim 6, wherein:
said window is disposed over an end portion of each of said striped lower electrodes such that both side edges of each of said striped lower electrodes is disposed interiorly within the corresponding side edges of its associated window.

13. An image sensor as set forth in claim 12, wherein:
each of said striped lower electrodes is substantially centered with respect to its associated window as viewed in the width directions thereof.

14. An image sensor, in which:
a light shielding film, having a window defined therein for controlling the quantity of incident light passing therethrough, is formed upon a photoelectric converting element of the sandwich type in which a photoelectric conversion layer of amorphous semiconductor material is sandwiched between upper and lower electrodes, and
wherein the area of said window is greater than the area of an overlapped region of said upper and lower electrodes which is disposed within said window and downstream of said window as viewed in the direction of travel of said incident light.

15. An image sensor as set forth in claim 14, wherein:
said amorphous semiconductor is hydrogenated amorphous silicon, and
an edge portion of said overlapped region of said upper and lower electrodes is disposed at a maximum of 15 $\mu$m interiorly within an edge portion of said window.

16. An image sensor as set forth in claim 14, wherein:
said amorphous semiconductor is hydrogenated amorphous silicon, and
an edge portion of said overlapped region of said upper and lower electrodes is disposed at a maximum of 15 μm interiorly within an edge portion of said window as viewed in a width direction thereof.

17. An image sensor comprising:
a substrate;
at least one photoelectric converting element disposed upon said substrate, said photoelectric converting element being of the sandwich type in which a photoelectric conversion layer is interposed between upper and lower electrodes;
a light shielding film disposed over said at least one photoelectric converting element;
said lower electrode of said at least one photoelectric converting element having the configuration of an elongated strip; and
a window defined within said light shielding film for controlling the quantity of light impinging upon said at least one photoelectric converting element,
wherein the width of said window is greater than the width of said elongated lower electrode strip such that the area of said window is greater than the area of an overlapped region of said upper and lower electrodes which is disposed within said window whereby at least one side edge portion of said elongated lower electrode strip is disposed interiorly of said window by means of a predetermined distance.

18. An image sensor as set forth in claim 17, wherein: said predetermined distance has a maximum value of 15 μm.

19. An image sensor as set forth in claim 17, wherein: said elongated lower electrode strip is substantially centered within said window area such that both side edge portions of said strip are disposed interiorly of said window.

20. An image sensor as set forth in claim 17, wherein: said window is disposed over an end portion of said lower electrode strip such that both side edge portions of said strip and an end edge portion thereof are all disposed interiorly of said window.

* * * * *